(12) United States Patent
Kasperkovitz

(10) Patent No.: US 6,788,922 B2
(45) Date of Patent: Sep. 7, 2004

(54) RADIO FM RECEIVER HAVING A FREQUENCY 2-DIVIDER AND A FREQUENCY 3-DIVIDER FOR ALTERNATIVELY DIVIDING A VCO SIGNAL FOR DOWN-CONVERTING A RECEIVED RADIO SIGNAL

(75) Inventor: Wolfdietrich Georg Kasperkovitz, Waalre (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 508 days.

(21) Appl. No.: 09/764,657

(22) Filed: Jan. 17, 2001

(65) Prior Publication Data

US 2002/0065057 A1 May 30, 2002

(30) Foreign Application Priority Data

Jan. 19, 2000 (EP) .............................. 00200207

(51) Int. Cl.[7] ................................ H04B 1/16
(52) U.S. Cl. .................... 455/205; 455/216; 455/190.1
(58) Field of Search ............................... 455/205, 216, 455/260, 207, 214, 42, 142, 143, 150.1, 160.1, 266, 511, 575.1, 550.1, 147, 112, 165.1, 139, 183.1, 208, 255, 258, 180.1, 188.1, 190.1, 191.3, 182.1; 331/25, 117 R; 327/359, 327; 375/222, 317, 376, 150, 48, 350, 332, 347, 344, 324, 325–328; 381/15, 2.7, 321; 332/112

(56) References Cited

U.S. PATENT DOCUMENTS

| 4,049,909 | A | * | 9/1977 | Peck ............................ 178/67 |
| 4,150,305 | A | * | 4/1979 | Streit et al. .................. 307/225 |
| 4,320,522 | A | * | 3/1982 | Hayes ........................... 375/48 |
| 5,239,699 | A | * | 8/1993 | Ecklund ...................... 455/142 |
| 5,332,975 | A | * | 7/1994 | Young et al. ................. 328/14 |
| 5,627,500 | A | * | 5/1997 | Wolaver et al. ............. 332/112 |
| 5,761,615 | A | | 6/1998 | Jaffee ......................... 455/314 |
| 5,896,562 | A | * | 4/1999 | Heinonen .................... 455/76 |
| 6,385,262 | B1 | * | 5/2002 | Gustafsson et al. ......... 375/350 |

* cited by examiner

*Primary Examiner*—Quochien B. Vuong
*Assistant Examiner*—C. Chow
(74) *Attorney, Agent, or Firm*—Edward W. Goodman

(57) ABSTRACT

A radio FM receiver is provided with a voltage-controlled oscillator which can be connected via a frequency 2-divider to a quadrature combination circuit for transforming down the frequencies of received radio signals and for supplying quadrature output signals. The receiver is further provided with detection and sound reproduction circuitry connected to this combination circuit. A frequency 3-divider is also present as well as a switching circuit for selectively connecting the mixer element to the oscillator either through the 2-divider or through the 3-divider.

5 Claims, 6 Drawing Sheets

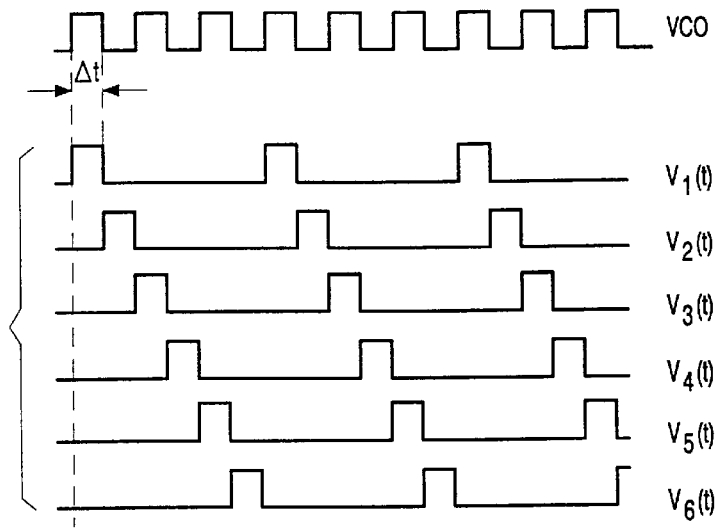
FIG. 3A
FIG. 3B
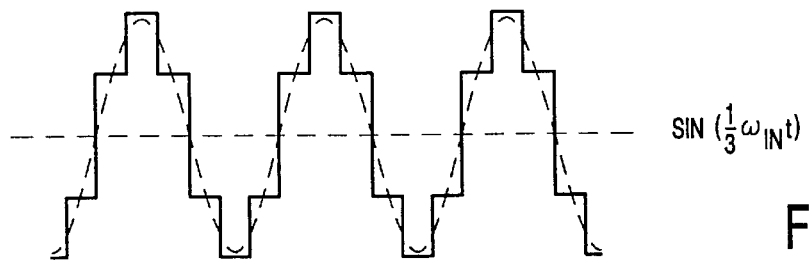
FIG. 3C
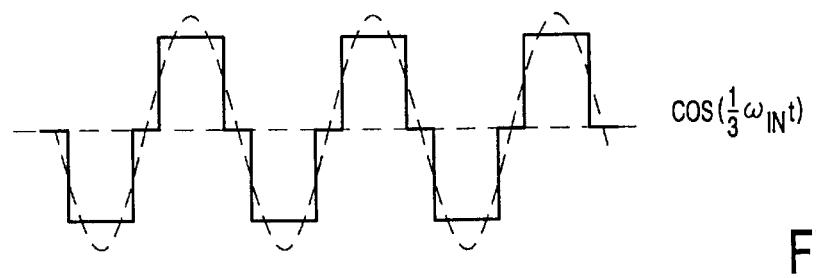
FIG. 3D

RADIO FM RECEIVER HAVING A FREQUENCY 2-DIVIDER AND A FREQUENCY 3-DIVIDER FOR ALTERNATIVELY DIVIDING A VCO SIGNAL FOR DOWN-CONVERTING A RECEIVED RADIO SIGNAL

BACKGROUND OF THE INVENTION

1. Field of the Invention

The invention relates to a radio FM receiver provided with a voltage-controlled oscillator which can be connected via a frequency 2-divider to a quadrature combination circuit for transforming down the frequency of received radio signals and for supplying quadrature output signals, as well as with detection and sound reproduction means connected to said combination circuit.

2. Description of the Related Art

A synthesizer is used in electronically tuned radios for tuning a voltage-controlled oscillator (VCO) to a desired reception channel. In practice, the VCO signal is directly supplied to a buffer and subsequently to a combination circuit. In a receiver architecture with integrated means for the suppression of image frequencies, however, the VCO is often tuned to a frequency higher than the frequency necessary for tuning to the desired channel. In such a situation, the oscillator is followed by a frequency divider, in particular a frequency 2-divider, for serving a quadrature combination circuit which renders possible a suppression of image frequencies. The output signals thereof may then be supplied to two buffers and subsequently, on a quadrature basis, to combination circuits connected thereto and operating at the same frequency.

Such a radio FM receiver is known, for example, from U.S. Pat. No. 5,761,615.

A car radio IC with the type designation TEA 6840 was developed in recent years. An object in the further development of this IC is to enhance its functions by providing a possibility of replacing blocks or adding functions in a manner such that the further development has a minimum influence on the basic construction of the IC.

The reception of the so-called Japanese band is one of the respects in which the TEA 6840 IC, which is attuned to the European/American band, is in need of improvement. A change in the tuning part is required for enhancing its functions. As was noted above, such a change must not result in a change in the basic construction of the IC; the tuning range of the VCO frequency must remain unchanged.

The desired reception channels in the FM mode usual in Europe and America lie between 87.3 MHz and 108.3 MHz. In Japan, however, the desired reception channels lie between 76 MHz and 90 MHz. Table I below lists the frequency bands of the reception channels, the oscillator frequency ranges, the combination frequency, the obtained center frequency, and the tuning voltage range of the oscillator for the situation in Europe/America (EU/US), a situation in Japan with the use of a 2-divider (2-JP), and the traditional situation in Japan (1-JP).

TABLE I

| | Received frequency $f_t$ in MHz | $F_{vco}$ In MHz | Combination frequency $f_M$ in MHz | Center frequency $f_{IF}$ in MHz | Tuning voltage in V |
|---|---|---|---|---|---|
| EU/US | 87.5 | 196 | $f_T + f_{IF}$ | 10.7 | 2.0 |
| | 108.3 | 238 | | | 5.5 |
| 2-JP | 76 | 173.4 | $f_T + f_{IF}$ | 10.7 | 1.0 |
| | 90 | 201.4 | | | 2.5 |
| 1-JP | 76 | 65.3 | $f_T - f_{IF}$ | 10.7 | Different |
| | 90 | 79.3 | | | type VCO |

The frequency 2-divider supplies a signal with a combination frequency $f_{EU}$ in a range from 98 MHz to 119 MHz in the case of an oscillator frequency $f_{VCO}$ lying in the range of 196 MHz to 238 MHz. The center frequency obtained in the mixer element during tuning for the European/American band, then lies at 10.7 MHz. The tuning voltage for the oscillator may vary from approximately 2 to 5.5 V in that case. For the Japanese band (from 76 to 90 MHz; see 2-JP in Table I), the same frequency 2-divider could be used for obtaining the center frequency of 10.7 MHz with an oscillator frequency in the range from 173.4 to 201.4 MHz. The tuning voltage for the oscillator may then vary from approximately 1 to 2.5 V. This situation is undesirable, however, on account of tuning problems which occur in practice. In the situations mentioned above, the frequency to which the unit is tuned lies below the combination frequency. In the traditional situation in Japan (1-JP in Table I), however, the combination frequency lies below the frequency to which the unit is tuned. Image frequency suppression problems then arise in the manufacture of a universal receiver which is suitable both for the European/American band and for the Japanese band.

SUMMARY OF THE INVENTION

It is, accordingly, an object of the invention to provide a radio FM receiver which is suitable for radio reception in Europe and America as well as in Japan and in which the above problems are avoided.

According to the invention, the radio FM receiver as described in the opening paragraph is, for this purpose, characterized in that, in addition, a frequency 3-divider is present by which the oscillator can be connected to the combination circuit, as well as switching means for connecting the mixer element to the oscillator either by the 2-divider or by the 3-divider.

Given an oscillator frequency $f_{VCO}$ lying, for example, in the range from 196 MHz to 238 MHz, the 2-divider will supply a signal with a combination frequency $f_{EU}$ in the range from 98 MHz to 119 MHz, and the 3-divider will supply a signal with a combination frequency $f_{JP}$ in the range from 65.3 MHz to 79.3 MHz. The center frequency obtained in the mixer element during tuning will then lie at 10.7 MHz both for the European/American band and for the Japanese band. The measures according to the invention render it possible to avoid the problems arising from the difference in frequency bands for Europe/America and Japan and the accompanying image frequency suppression problems, as well as the differences in VCO tuning voltages; see Table II

TABLE II

| | Received frequency $f_t$ in MHz | $F_{vco}$ In MHz | Combination frequency $f_M$ in MHz | Center frequency $f_{IF}$ in MHz | Tuning voltage in V |
|---|---|---|---|---|---|
| 3-JP | 76 | 196 | $f_T - f_{IF}$ | 10.7 | 2.0 |
| | 90 | 238 | | | 5.5 |

If a frequency 2-divider only is used, i.e., if the European/American and Japanese frequency bands need not be combined, the quadrature signals may easily be obtained with a duty cycle of 50% through switching on the flanks of the VCO signal. A frequency 3-divider with a duty cycle of 50%, however, cannot be obtained in this manner. If the flanks of one of the quadrature signals coincide with the flanks of the VCO signal, the flanks of the other quadrature signal will coincide with the center of a pulse in the VCO signal; the latter quadrature signal cannot be obtained then through switching on the flanks of the VCO signal. It is obviously also possible to generate the second quadrature signal in that the first one is subjected to a phase shift of 90°. This, however, will lead to errors of the order of ±3° for the frequency band under discussion here, which is unacceptably high.

To solve this problem, the radio FM receiver is, in addition, characterized in that the frequency 3-divider is provided with a divider circuit which supplies n cyclical output signals $V_n(t)$ for every three VCO signal cycles, for which it is true that $V_n(t)=V_1(t-(n-1)\Delta t)$ with n=1, ..., 6, and $\Delta t$=the duration of half a VCO cycle, and is provided with two summation networks in each of which the cyclical output signals are combined with predetermined weighting factors designed for obtaining a quadrature component, whereupon the combination signal thus obtained is conducted through a low-pass filter. A frequency 3-divider which is highly accurate in generating quadrature signals becomes possible in this manner, which implies that it also makes sense to include it together with a 2-divider in the radio FM receiver so as to make the latter suitable for reception both in the European/American band and in the Japanese band.

In a preferred embodiment, the weighting factors for obtaining a first quadrature component have a mutual ratio of (−2, +2, +4, +2, −2, −4), and those for obtaining the other quadrature component have a mutual ratio of (−3, −3, 0, +3, +3, 0). Cyclical interchange is to be included therein.

The invention relates not only to a radio FM receiver, but also to a frequency divider which can be used in a radio FM receiver. According to the invention, said frequency divider is provided with a divider circuit which supplies n cyclical output signals $V_n(t)$ for every 1/2n oscillator signal cycles, for which it is true that $V_n(t)=V_1(t-(n-1)\Delta t)$, with n being an integer number and $\Delta t$ the duration of half an oscillator cycle, and is provided with at least one summation network in which the cyclical output signals are combined with predetermined weighting factors, whereupon the combination signal thus obtained is conducted through a low-pass filter. A comparatively simple 3-divider for use in a radio FM receiver as described above is obtained for n=6 and with two summation networks. Alternative values of n are also possible. n may be equal to 4 in the case of a 2-divider. It is also possible to form signals with a certain frequency from any number of oscillator cycles through adaptation of the weighting factors; a direct relation between the number of oscillator cycles and the frequencies to be formed is not necessary in that case.

BRIEF DESCRIPTION OF THE DRAWINGS

The invention will now be explained in more detail with reference to the accompanying drawing, in which:

FIGS. 3A, 3B, 3C, and 3D are a number of diagrams with reference to which the operation of the 3-divider of FIG. 2 will be explained;

DESCRIPTION OF THE PREFERRED EMBODIMENTS

Figure 1:
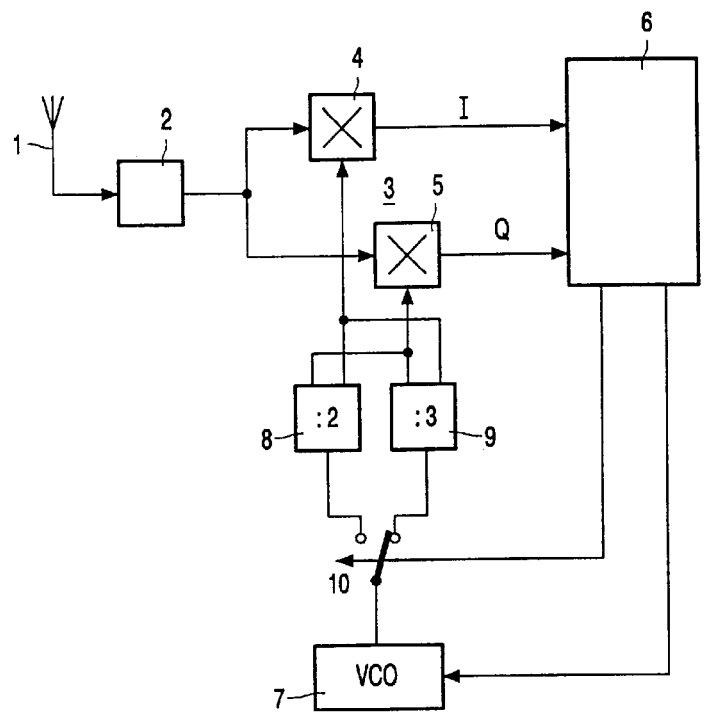
FIG. 1 is a block diagram of a radio FM receiver according to the invention.

The radio FM receiver, shown as a block diagram in FIG. 1, comprises an antenna 1, a radio frequency receiver part 2, and a combination circuit 3 including two mixer units 4 and 5 for obtaining center frequency quadrature signals I and Q, and detection and sound reproduction means 6 connected to the combination circuit 3. A voltage-controlled oscillator (VCO) 7 is present having an oscillator control range such that a division by two of this frequency will cover the control range for the combination frequency for the reception of radio signals over the reception channels usual in Europe and America, whereas a division by three of this frequency will cover the control range for the combination frequency for the reception of radio signals through the channels usual in Japan. As was noted above, an oscillator frequency $f_{VCO}$ lying, for example, in the range from 196 MHz to 238 MHz will cause the 2-divider to supply a signal with a combination frequency $f_{EU}$ in the range from 98 MHz to 119 MHz, and the 3-divider to supply a signal with a combination frequency $f_{JP}$ in the range from 65.3 MHz to 79.3 MHz. The center frequency obtained in the mixer units during tuning will then lie at 10.7 MHz both for the European/American band (98–119 MHz) and for the Japanese band (65.3–79.3 MHz).

A 2-divider 8 and a 3-divider 9 are connected to the VCO 7 for a division of the frequency by two and by three, respectively. Either the output signals of the 2-divider 8 or the output signals of the 3-divider 9 are supplied to the mixer units 4 and 5, i.e., via switching means 10. The center frequency quadrature signals I and Q obtained after combination in the mixer units 4 and 5 are subsequently supplied to the detection and sound reproduction means 6. The latter unit also comprises control means for controlling the VCO 7 and the switching means 10.

Various known types of 2-dividers with a duty cycle of 50% may be used as the 2-divider 8 connected to the VCO. An accurate 3-divider with a duty cycle of 50, however, was not known until now. An embodiment of such a 3-divider is shown in the block diagram of FIG. 2.

Figure 2:
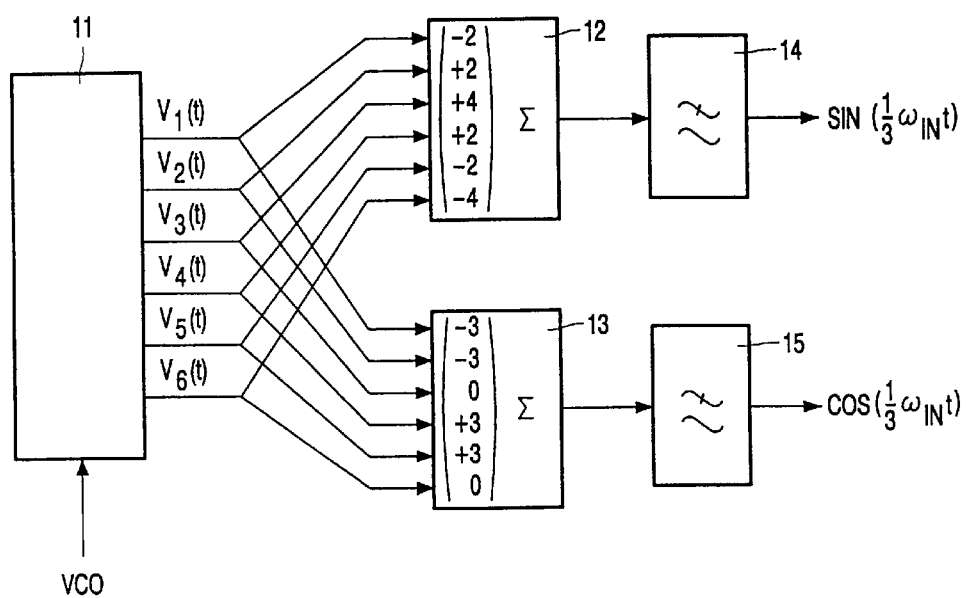
FIG. 2 shows a frequency 3-divider according to the invention which is used in the radio FM receiver of FIG. 1.

The 3-divider shown in FIG. 2 comprises a divider circuit 11 which provides n cyclical output signals $V_n(t)$ for every three VCO signal cycles, for which it holds, in this embodiment, that $V_n(t)=V_1(t-(n-1)\Delta t)$ with n=1, . . . , 6, and $\Delta t$ is the duration of half a VCO cycle, and comprises two summation networks 12 and 13 in each of which the cyclical output signals are combined with predetermined weighting factors designed for obtaining a quadrature component, whereupon the combination signal thus obtained is conducted through a respective low-pass filter 14, 15.

The VCO signal is shown in FIG. 3A. The signals $V_n(t)$ derived therefrom are depicted in FIG. 3B. Multiplication of these signals $V_n(t)$ by respective weighting factors −2, +2, +4, +2, −2, −4 in the summation network 12 and subsequent addition yields a signal as shown in FIG. 3C, this signal resulting in a signal $\sin(1/3 \cdot \omega t)$ after filtering in the low-pass filter 14. Multiplication of the signals $V_n(t)$ by respective weighting factors −3, −3, 0, +3, +3, 0 in the summation network 13 and subsequent addition leads to a signal as shown in FIG. 3D, this signal resulting in a signal $\cos(1/3 \cdot \omega t)$ after filtering in the low-pass filter 15. The signals obtained have a frequency which is 1/3 of the frequency of the VCO, but they have a phase difference of 90°; the quadrature signals I and Q can be obtained in the mixer units 4 and 5 by means of these signals.

Figure 4:
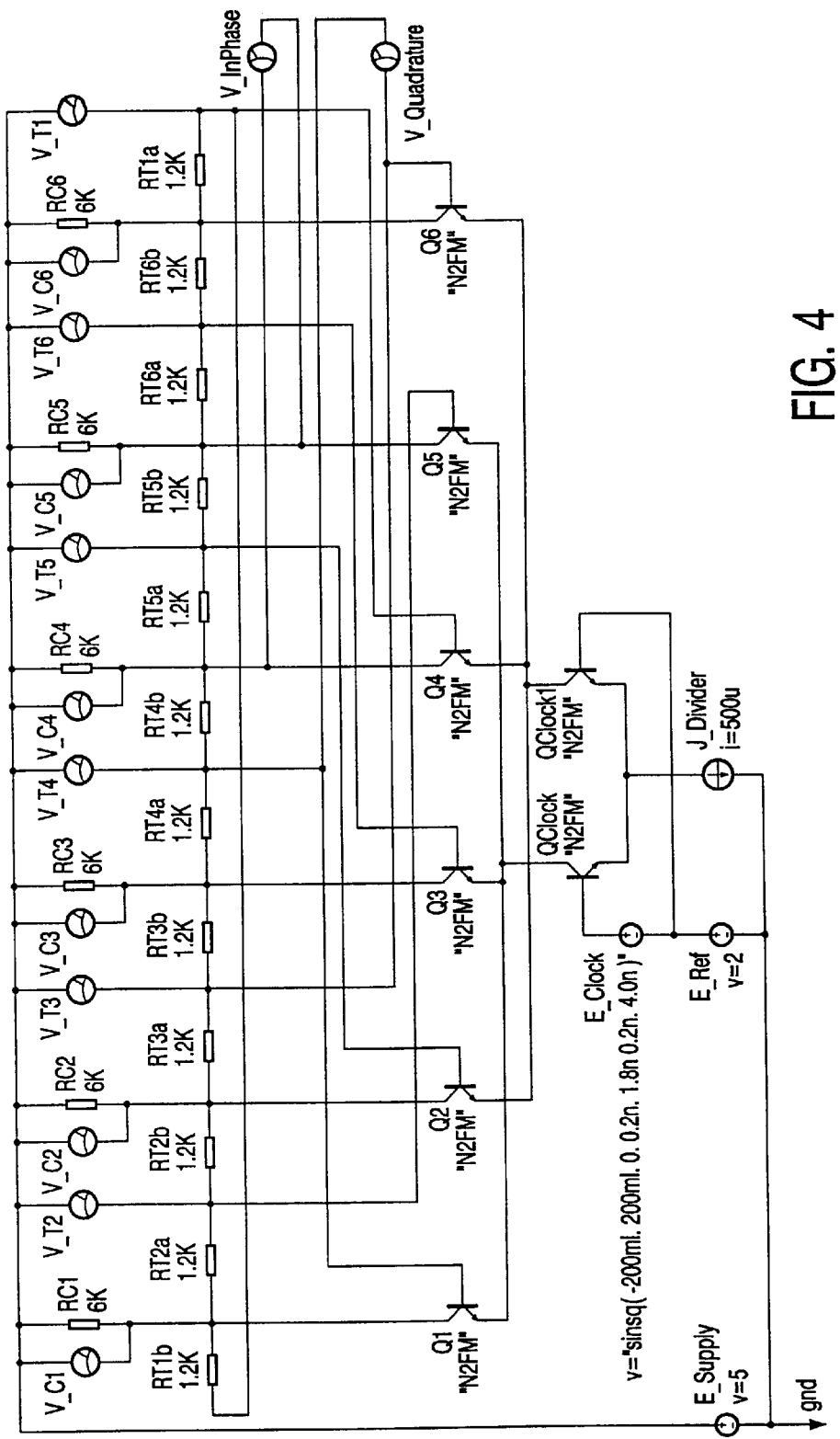
FIG. 4 shows a more detailed embodiment of the divider circuit and the two summation networks in the frequency 3-divider.
Figure 5:
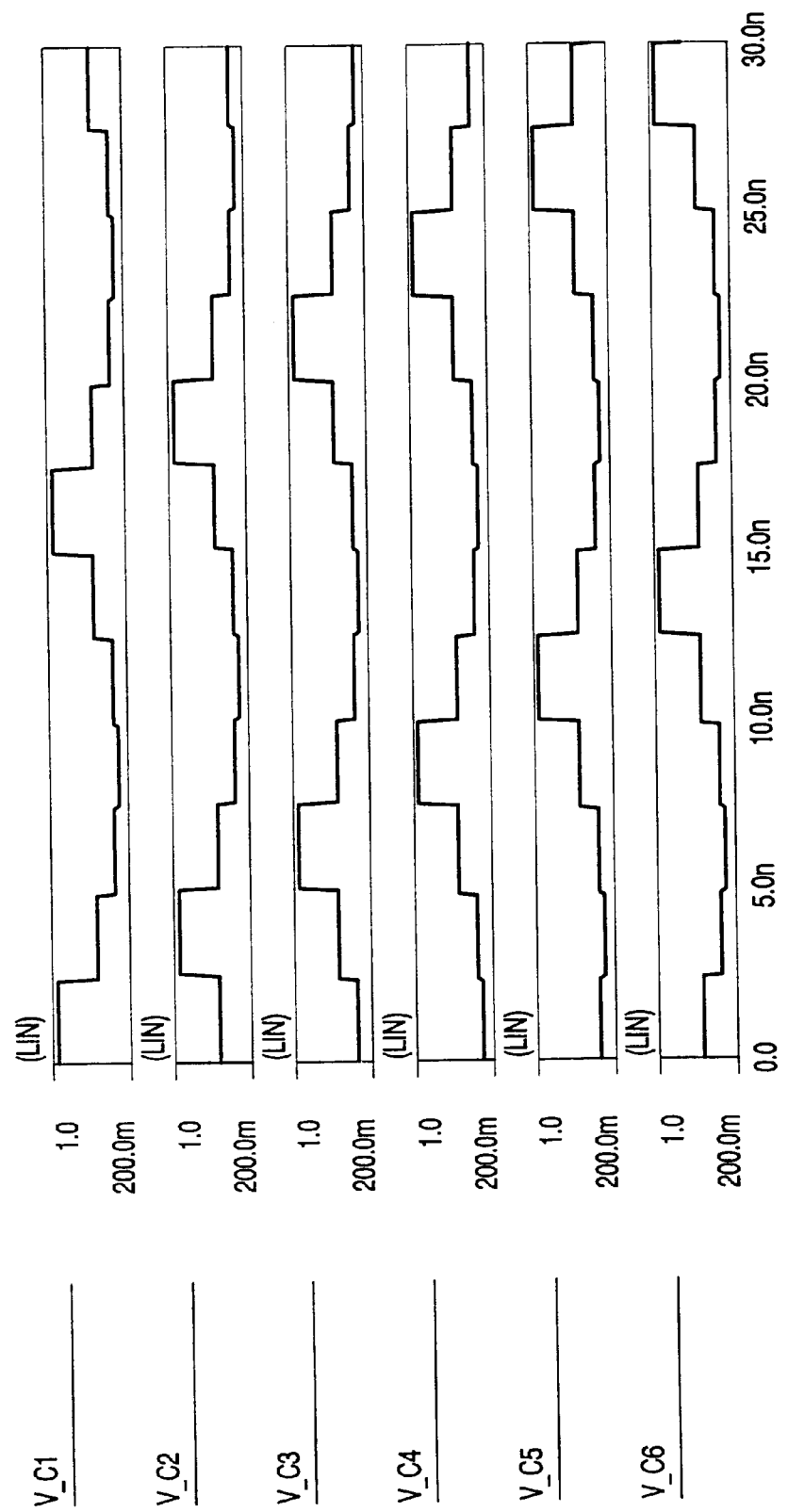
FIG. 5 shows a number of diagrams serving to elucidate the operation of the embodiment shown in FIG. 4.

A more detailed embodiment of the divider circuit and the two summation networks is shown in FIG. 4. This circuit is built up from a resistance network, switching transistors Q1, Q2, . . . , Q6, which are brought into the conductive state consecutively during half a VCO cycle, and two control transistors Qc11 and Qc12 which are triggered by the VCO signal with a phase difference of 180°. The voltages across the collector resistances Rc1, Rc2, . . . , Rc6 are referenced V_c1, V_c2, . . . , V_c6. Assuming that Q1 and Qc11 pass current, V_c1 will be highest, whereas V_c2, . . . , V_c6 will have stepwise decreasing and increasing values as indicated in FIG. 5. The tap voltage values V_T4 and V_T5 will make the bases of Q1 and Q2 "high", while the other tap voltage values will keep the bases of the other transistors Q3–Q6 "low". Q2 and Qc12 will then also pass current in the next half VCO cycle. Now, V_c2 will be highest, and V_c3, . . . , V_c6, V_c1 will decrease and increase stepwise as indicated in FIG. 5. The tap voltage values V_T5 and V_T6 will make the bases of Q2 and Q3 "high", so that Q3 and Qc11 will be able to pass current in the next half VCO cycle. A cyclical voltage gradient is thus obtained for V_c1, . . . , V_c6. The resistance network realizes a weighting and a summation at the same time. In other words, the divider circuit 11 and the two summation networks 12 and 13 have been integrated. The two quadrature signals can be derived from the collector and tap voltages. Thus, for example, the one quadrature signal may be derived from the voltage difference between the collectors of Q4 and Q5, and the other quadrature signal from the difference between the tap voltages V_T4 and V_T3.

Figure 6:
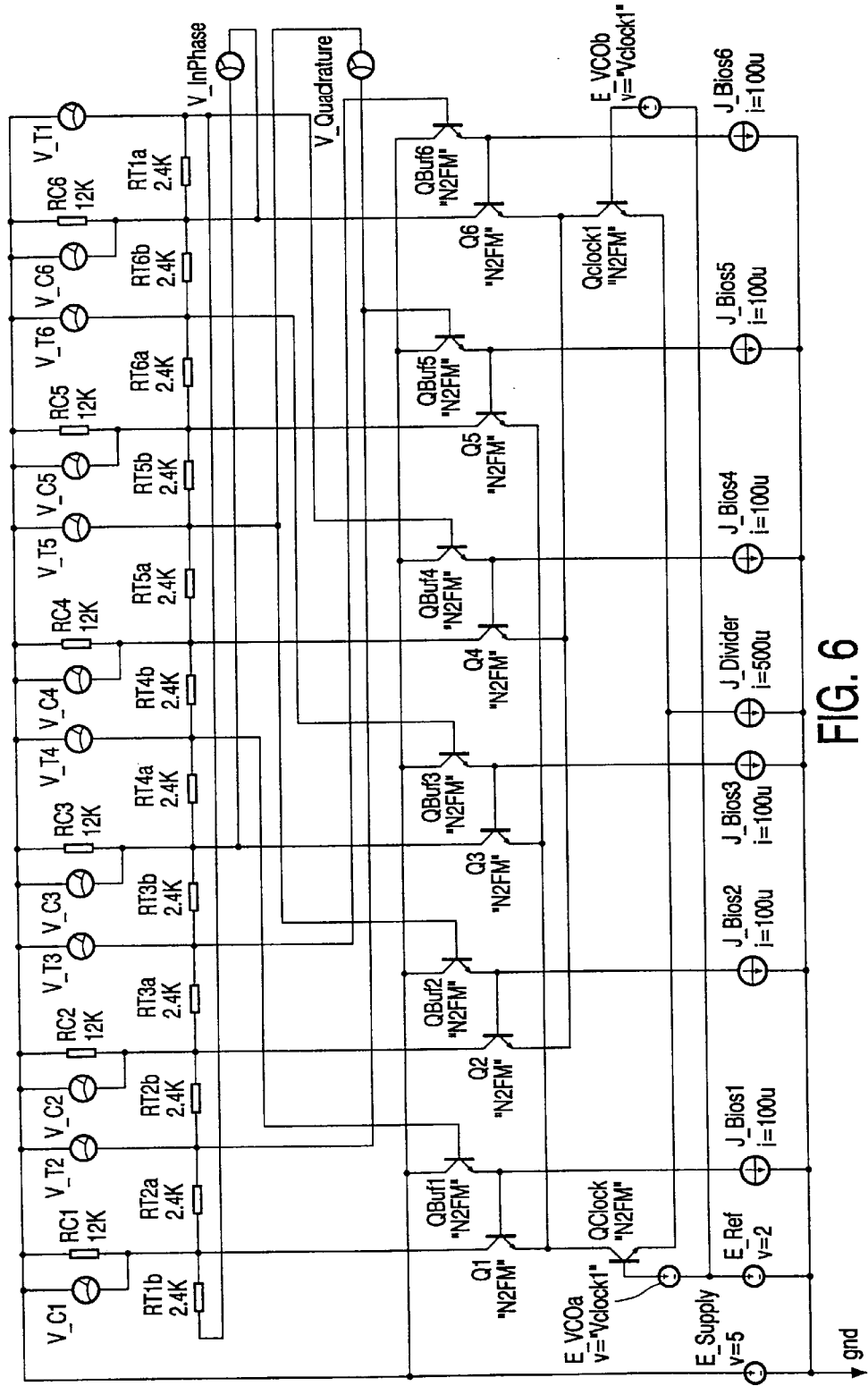
FIG. 6 shows a more detailed second embodiment of the divider circuit and the two summation networks in the frequency 3-divider.

FIG. 6 shows an improved embodiment in which the bases of the switching transistors are controlled from an emitter follower. Problems caused by a base current of the conducting switching transistor which is not equal to zero are avoided thereby. In addition, the collector voltage of the switching transistor may be raised without the risk of the transistor entering the saturated state. Furthermore, the one quadrature signal is derived from the voltage difference between the collectors of Q3 and Q6 here, while the other quadrature signal is derived from the difference between the tap voltages V_T5 and V_T2. More symmetrical quadrature voltages are obtained thereby.

Figure 7:
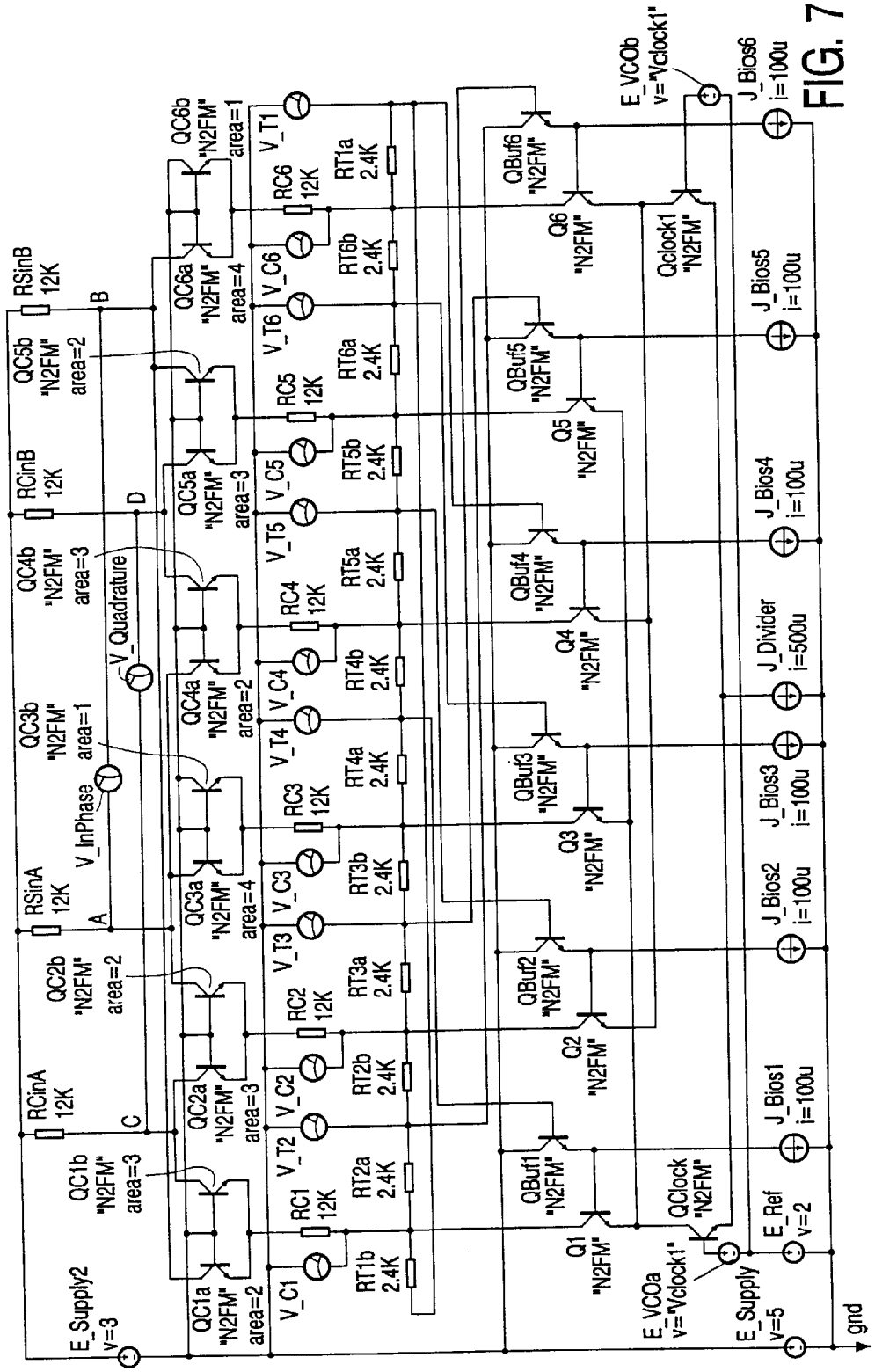
FIG. 7 shows a more detailed embodiment of a complete frequency 3-divider.

FIG. 7 is a more detailed diagram of an embodiment of a complete 3-divider. This circuit represents the circuit shown in FIG. 6 augmented with two separate current summation networks including weighting factors, formed by the transistor circuits QC1a,b QC2,a,b, . . . , QC6a,b, and low-pass filters connected thereto and formed by the resistors RcosA, RcosB, RsinA, and RsinB, and the parasitic capacitances of the transistors in the individual summation networks. The one filtered quadrature signal, obtained with the weighting factors −2, +2, +4, +2, −2, −4, is derived from the voltage difference between the points A and B, the voltage at point A being built up by the currents through Q2, Q3, and Q4, and the voltage at point B being built up by the currents through Q1, Q5, and Q6. The other filtered quadrature signal is derived from the voltage difference between the points C and D, the voltage at point C being built up by the currents through Q1 and Q2, and the voltage at point D being built up by the currents through Q4 and Q5. In the latter case, weighting by a factor 0 is realized in that the currents through Q3 and Q6 are not included in determining the voltages at points C and D. In this manner, accordingly, the output signals of the 3-divider are derived from the voltage difference between the points where the collector currents with positive weighting factors were added together and the points where the collector currents with negative weighting factors were added together.

What is claimed is:

1. A radio FM receiver comprising:

a voltage-controlled oscillator;

a frequency 2-divider coupled to an output of said voltage-controlled oscillator;

a quadrature combination circuit;

detection and sound reproduction means connected to said quadrature combination circuit wherein said voltage-controlled oscillator, said frequency 2-divider and said quadrature combination circuit transform down a frequency of received radio signals and supply quadrature output signals for said detection and sound reproduction means;

a frequency 3-divider; and switching means for selectively connecting the voltage-controlled oscillator to the quadrature combination circuit via either the frequency 2-divider or the frequency 3-divider, characterized in that the frequency 3-divider comprises:

a divider circuit for supplying n cyclical output signals $V_n(t)$ for every three VCO signal cycles, where $V_n(t)=V_1(t-(n-1)\Delta t)$ with n=1, . . . , 6, and $\Delta t$=the duration of half a VCO cycle;

two summation networks each receiving the n cyclical output signals and each combining the n cyclical output signals with predetermined weighting factors, respectively, for forming respective quadrature components; and two low-pass filters coupled, respectively, to outputs of said two summation networks for low-pass filtering the respective quadrature components.

2. The radio FM receiver as claimed in claim 1, characterized in that the predetermined weighting factors for obtaining a first of said respective quadrature components have a mutual ratio of (−2, +2, +4, +2, −2, −4), and the predetermined weighting factors for obtaining a second of said respective quadrature components have a mutual ratio of (−3, −3, 0, +3, +3, 0).

3. The radio FM receiver as claimed in claim 1, characterized in that the divider circuit, the summation networks, and the low-pass filters together form an integrated unit.

4. A radio FM receiver comprising:

a voltage-controlled oscillator;

a frequency 2-divider coupled to an output of said voltage-controlled oscillator;

a quadrature combination circuit; and detection and sound reproduction means connected to said quadrature combination circuit wherein said voltage-controlled oscillator, said frequency 2-divider and said quadrature combination circuit transform down a frequency of received radio signals and supply quadrature output signals for said detection and sound reproduction means, wherein said radio FM receiver further comprises:

a frequency 3-divider; and switching means for selectively connecting the voltage-controlled oscillator to the quadrature combination circuit via either the frequency 2-divider or the frequency 3-divider, and wherein the frequency 3-divider includes:

a divider circuit for supplying n cyclical output signals $V_n(t)$ for every three VCO signal cycles, where $V_n(t)=V_1(t-(n-1)\Delta t)$ with n=1, . . . , 6, and $\Delta t$=the duration of half a VCO cycle;

two summation networks each receiving the n cyclical output signals and each combining the n cyclical output signals with predetermined weighting factors, respectively, for forming respective quadrature components; and two low-pass filters coupled, respectively, to outputs of said two summation networks for low-pass filtering the respective quadrature components, characterized in that the frequency 3-divider comprises:

two control transistors triggered by the VCO signal;

a first three switching transistors being controlled by a first of said two control transistors, and a second three switching transistors being controlled by a second of said two control transistors; and a resistance network comprising collector resistances of the switching transistors, wherein said resistance network allows a current to flow through one of the switching transistors with the accompanying collector resistance in every half VCO cycle, and during said half VCO cycle, allows stepwise decreasing and increasing currents to flow through the other collector resistances, and in each subsequent half VCO cycle, allows a next switching transistor to pass current each time in a cyclical succession.

5. The radio FM receiver as claimed in claim 4, characterized in that the output signals of the frequency 3-divider are derived from a voltage difference between points where the collector currents with positive weighting factors are added together and points where the collectors current with negative weighting factors are added together.

* * * * *